(12) United States Patent
Lim et al.

(10) Patent No.: US 6,380,106 B1
(45) Date of Patent: Apr. 30, 2002

(54) METHOD FOR FABRICATING AN AIR GAP METALLIZATION SCHEME THAT REDUCES INTER-METAL CAPACITANCE OF INTERCONNECT STRUCTURES

(75) Inventors: Seng Keong Victor Lim; Young-way Teh; Ting-Cheong Ang; Alex See; Yong Kong Siew, all of Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/721,719

(22) Filed: Nov. 27, 2000

(51) Int. Cl.[7] ............................................. H01L 21/31
(52) U.S. Cl. ..................................... 438/778; 438/619
(58) Field of Search ................................ 438/778, 619, 438/623, 421, 780, 781

(56) References Cited

U.S. PATENT DOCUMENTS

| | | | |
|---|---|---|---|
| 5,461,003 A | | 10/1995 | Havemann et al. .......... 437/187 |
| 6,071,805 A | * | 6/2000 | Liu .............................. 438/619 |
| 6,071,830 A | | 6/2000 | Matsuzawa et al. ......... 438/778 |
| 6,141,072 A | * | 10/2000 | Drabik et al. ................ 349/122 |
| 6,150,232 A | * | 11/2000 | Chan et al. ................... 438/421 |
| 6,162,838 A | * | 12/2000 | Kohl ........................... 521/77 |
| 6,165,890 A | * | 12/2000 | Kohl et al. ................... 438/619 |

\* cited by examiner

*Primary Examiner*—David Nelms
*Assistant Examiner*—David Vu
(74) *Attorney, Agent, or Firm*—George O. Saile; Rosemary L. S. Pike; William J. Stoffell

(57) ABSTRACT

A method of manufacturing a metallization scheme with an air gap formed by vaporizing a filler polymer material. The filler material is covered by a critical permeable dielectric layer. The method begins by forming spaced conductive lines over a semiconductor structure. The spaced conductive lines have top surfaces. A filler material is formed over the spaced conductive lines and the semiconductor structure. The filler material is preferably comprised of a material selected from the group consisting of polypropylene glycol (PPG), polybutadine (PB) polyethylene glycol (PEG), fluorinated amorphous carbon and polycaprolactone diol (PCL) and is formed by a spin on process or a CVD process. We etch back the filler material to expose the top surfaces of the spaced conductive lines. Next, the semiconductor structure is loaded into a HDPCVD chamber. In a critical step, a permeable dielectric layer is formed over the filler material. The permeable dielectric layer has a property of allowing decomposed gas phase filler material to diffuse through. In another critical step, we vaporize the filler material changing the filler material into a vapor phase filler material. The vapor phase filler material diffuses through the permeable dielectric layer to form a gap between the spaced conductive lines. An insulating layer is formed over the permeable dielectric layer.

11 Claims, 5 Drawing Sheets

METHOD FOR FABRICATING AN AIR GAP METALLIZATION SCHEME THAT REDUCES INTER-METAL CAPACITANCE OF INTERCONNECT STRUCTURES

BACKGROUND OF INVENTION

1) Field of the Invention

This invention relates generally to fabrication of semiconductor devices and more particularly to the fabrication of an inter metal dielectric (IMD) layers that have air gaps and most particularly to a metallization scheme using air gaps between metal lines and interconnects.

2) Description of the Prior Art

The formation of air gaps between conducting lines of high speed Integrated Circuits (IC's) is typically a combination of the deposition of a metal layer, selective etching of the metal layer to form the desired line patterns, the deposition of a porous dielectric layer or a disposable liquid layer which is then selectively removed to form the desired air-gaps.

The continuing effort to reduce the size of individual transistors and other devices commonly integrated on a semiconductor chip and to increase the density of Integrated Circuits results in a continuing reduction of the separation between conducting layers of materials. This reduction results in an increase of capacitive crosstalk between adjacent conductor lines of a semiconductor circuit, that is the voltage on the first conductor line alters or affects the voltage on the second conductor line. This alteration in voltage can cause erroneous voltage levels in the Integrated Circuit making the IC increasingly prone to faulty operation. It becomes therefore imperative to reduce the resistive capacitance (RC) time constant and the crosstalk between adjacent conducting lines.

The capacitance between adjacent conducting lines is highly, dependent on the insulator or dielectric used to separate the conducting lines. Conventional semiconductor fabrication typically uses silicon dioxide as a dielectric, this has a dielectric constant of about 3.9.

The use of many of the low dielectric constant materials is not feasible due to the fact that equipment is not available to properly process the new dielectric materials in various integrated circuits. Also, the chemical or physical properties of many low dielectric constant materials are usually difficult to make compatible with or integrate into conventional integrated circuit processing.

The lowest possible and therefore the ideal dielectric constant is 1.0, this is the dielectric constant of a vacuum whereas air has a dielectric constant of less than 1.001

To reduce capacitive coupling and to reduce capacitive crosstalk, a major objective in the design of IC's is to reduce the Dielectric Constant (k) of the insulating layer between adjacent conductor lines of semiconductor circuits. The present invention makes a significant contribution within the scope of this effort.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,071,805(Liu) shows an air gap between lines. U.S. Pat. No. 6,071,830(Matsuzawa et al.) shows an air gap by an organic layer that expands when heated. U.S. Pat. No. 5,461,003(Havemann et al.) shows air gaps between metal lines formed by etching an organic filler through an oxide layer.

However, further improvements in air gap IMD metalization structures are needed.

SUMMARY OF THE INVENTION

It is an object of the present invention to provide a method for fabricating a metallization scheme.

It is an object of the present invention to provide a method for fabricating a metallization scheme having air gaps between metal lines.

It is an object of the present invention to provide a method for fabricating a metallization scheme having an air gap formed by vaporizing a filler material through a permeable dielectric layer.

It is an object of the present invention to provide a method for fabricating a metallization structure having an air gap formed by vaporizing a filler material through a permeable dielectric layer using an insitu process.

To accomplish the above objectives, the present invention provides a method of manufacturing a metallization scheme with an air gap which is characterized as follows. Spaced conductive lines are formed over a semiconductor structure. The spaced conductive lines have top surfaces. A filler material is formed over the spaced conductive lines and the semiconductor structure. The filler material is preferably comprised of a low molecular weight organic polymer such as polypropylene glycol (PPG), polybutadine (PB) polyethylene glycol(PEG) and polycaprolactone diol (PCL) and is formed by a spin on process or CVD process. We etch back the filler material to expose the top surfaces of the spaced conductive lines. Next, the semiconductor structure is loaded into a HDPCVD chamber.

In a critical step, a permeable dielectric layer formed is over the filler material. The permeable dielectric layer has a property of allowing decomposed gas phase filler material to diffuse through. The permeable dielectric layer is thin enough to allow the vaporized/decomposed gas phase filler material to diffuse through.

In another critical step, we vaporize the filler material changing the filler material into a vapor phase filler material. The vapor phase filler material diffuses through the permeable dielectric layer to form a gap between the spaced conductive lines. The filler material vaporization is performed at a higher temperature than the deposition temperature of the permeable dielectric layer. Next, an insulating layer is deposited over the permeable dielectric layer. Now, we preferably remove the semiconductor structure from the HDPCVD chamber.

Important features of the present invention are the permeable dielectric layer that the filler layer diffuses through to create the air gap. The filler material is covered by the permeable dielectric layer and is not exposed to the atmosphere. This is a critical difference compared to the prior arts. Also, the permeable dielectric layer prevents the insulating layer from filling in the air gap. Also, the filler material is vaporized/decomposed by an insitu HPDCVD plasma process at an elevated temperature. Preferably the filler material is polybutadine (PB) or fluorinated amorphous carbon (a-FiC).

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings.

Figure 1:
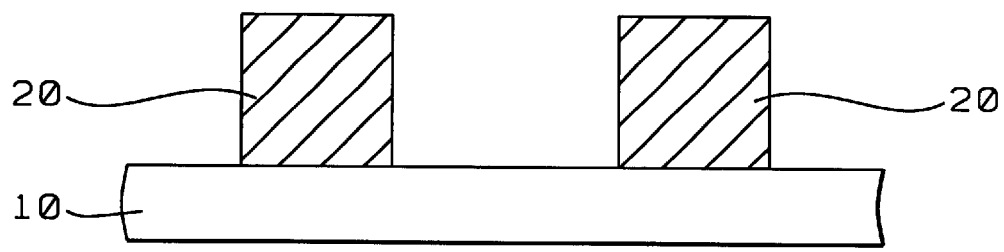
FIGS. 1 through 7 are cross sectional views for illustrating a method for forming metallization structure with an air gap according to a preferred embodiment of the present invention.

As shown in FIG. 1, spaced conductive lines 20 are formed over a semiconductor structure 10. The spaced conductive lines 20 have top surfaces.

The semiconductor structure can represent a substrate or wafer with devices (e.g., FETs) formed in on an the wafer surface and possibly having insulating layers (e.g., interlevel dielectric (IDL) or inter metal dielectric (IMD) layer) and conductive layers (e.g., polysilicon or metal) thereover. The top surface of the semiconductor structure is preferably comprised of a dielectric layer, such as an oxide inter metal dielectric (IMD) layer.

Within the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication.

The spaced conductive lines are preferably comprised of an aluminum alloy.

Figure 2:
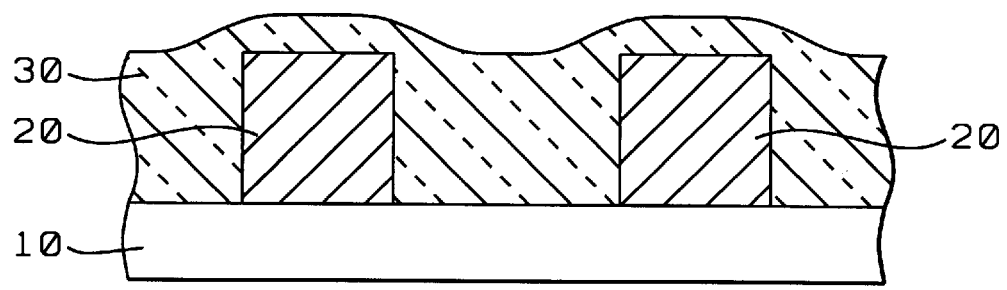

As shown in FIG. 2, we form a filler material 30 (e.g., thermally unstable material) over the spaced conductive lines and the semiconductor structure. The thermally unstable filler material preferably decomposes and vaporizes at a temperature between 250 and 500° C.

The filler material can be any spin on or chemical vapor deposition polymer material that decomposed and vaporized at a temperature between 250 and 450° C. and can diffuse through the permeable dielectric layer (see below). When the filler material decompose or vaporizes (changes from liquid or solid into a gas phase) the polymer material breaks down into smaller gas molecules that can diffuse thru the permeable dielectric layer 40.

The filler material 30 preferably is comprised of polypropylene glycol (PPG), polybutadine (PB) polyethylene glycol (PEG) and polycaprolactone diol (PCL) or amorphous carbon (a-FiC), silicon gel or organic silaxone. These filler material are superior to other organic polymers because they are compatible with the process and have ease of application. The filler material 30 most preferably is comprised of fluorinated amorphous carbon (a-FiC) which is CVD deposited. The filler material is preferably formed by a spin on process or CVD process.

The filler material 30 is comprised of a "thermally unstable polymer" that vaporized (e.g., decomposes) at a temperature between 350 and 500° C. and more preferably between 415 and 435° C.

Figure 3:
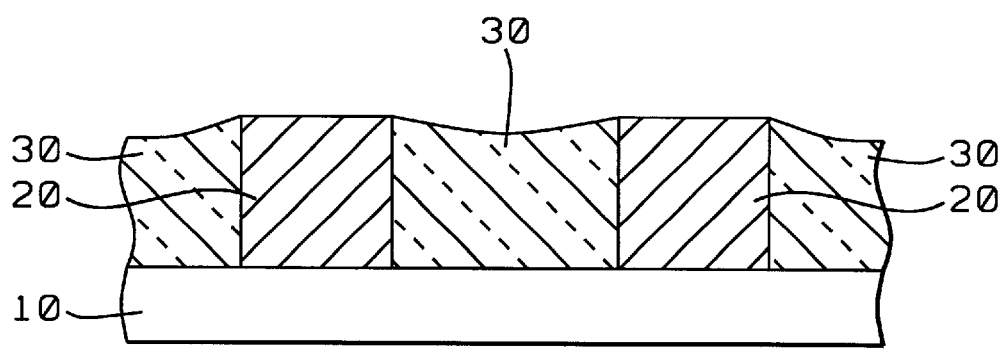

As shown in FIG. 3, the filler material 30 is etched to expose the top surfaces of the spaced conductive lines 20.

The etch back is performed by a reactive ion etch (RIE) using an oxygen plasma.

Insitu Steps

Figure 4:
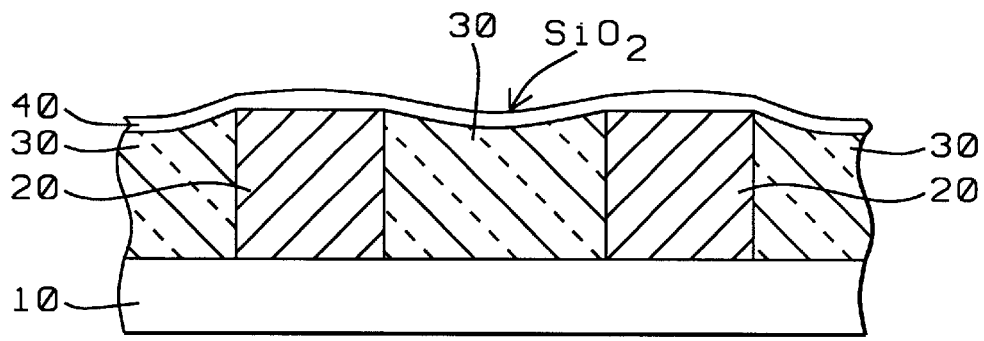
Figure 5:
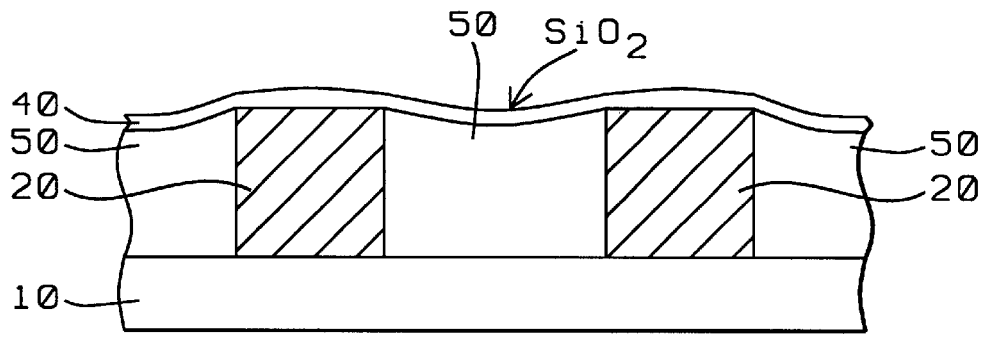
Figure 6:
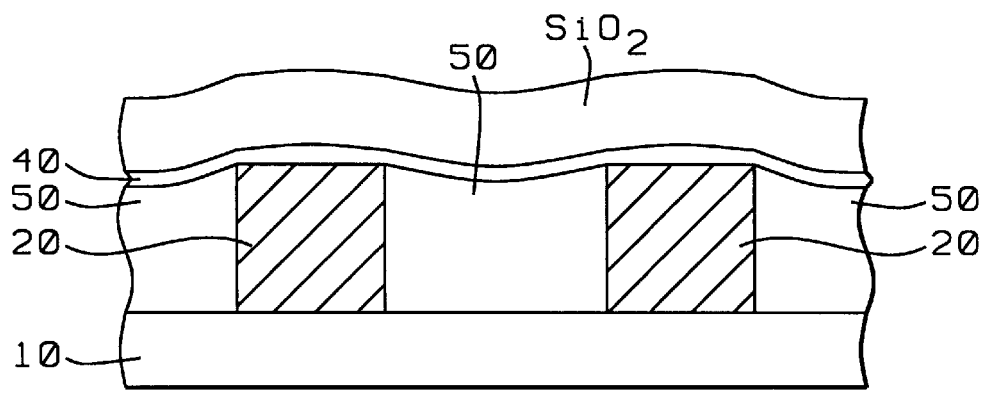

The steps shown in FIGS. 4, 5, and 6, are preferably performed in situ in a HDPCVD tool. (The steps are (1) deposit a permeable dielectric layer 40, (2) vaporize filler layer (3) deposit insulating layer 50.) That means that the wafer remains in the same chamber without breaking vacuum. A HDPCVD tool is a tool capable of high density plasma sources supply low-energy ions with densities greater than $1E12\ cm^{-2}$. For example, the step in FIG. 4, 5, and 6 can be performed a HDPCVD tool model ultima 40A by Applied Materials or in a model speed II sequal by Novellus Company.

As shown in FIG. 4, we load the semiconductor structure 10 into a HDPCVD chamber.

As shown in FIG. 4, we form a permeable dielectric layer 40 over the filler material 40. The permeable dielectric layer 40 has a property of allowing (vaporized, decomposed) gas phase filler material to diffuse through.

The permeable dielectric layer 40 is formed a HDPCVD process. The permeable dielectric layer is deposited using a high density plasma chemical vapor deposition (HDPCVD) process and uses a Si-containing gas ($SiH_4$), Ar carrier and $O_2$ gas and is performed at a temperature between 325 and 375° C.

The permeable dielectric layer is preferably comprised of oxide. The permeable dielectric layer preferably has a thickness of between about 200 and 500 Å.

Insitu Vaporization of the Filler Material 40

Preferably, the deposition of the permeable dielectric layer and vaporization of the filler material and the deposition of the insulating layer are performed insitu in the same HDPCVD chamber without breaking vacuum.

As shown in FIG. 5, we vaporizing the filler material 40 changing the filler material into a vapor phase filler material. The vapor phase filler material diffusing through the permeable dielectric layer 40 to form a gap 50 between the spaced conductive lines 20.

The vaporizing the filler material 40 is performed by a plasma (HDPCVD) at a higher temperature than the deposition temperature of the permeable dielectric layer.

When we decompose the filler material, the organic material breaks down into small C containing molecules in the vapor phase, that allows the molecules to diffuse thru the permeable dielectric layer.

When the filler layer 30 is heated, the layer decomposes (e.g., breaks into smaller molecules) and vaporizes (change to gas phase) . The filler material 30 is treated with heat.

The decomposition and vaporization is performed by a heating process at a relatively elevated temperature compared to the cap layer deposition temperature. The filler material is subjected to a HDPCVD plasma containing $O_2$ and Ar plasma at a temperature between 415 and 435° C.

Most preferable, the HDPCVD parameter given above for the permeable dielectric layer 40 deposition are modified to vaporized the filler material by:

1) shutting off the $SiH_4$ flow, and continuing the Ar and $O_2$ flows, continuing the plasma power to raise the substrate/wafer temperature, (not to bombard the wafer with plasma ions).
2) turning off the cooling He gas flow to the chuck to raise the wafer chuck and wafer temperature of between temperature between 415 and 435° C.

Figure 8:
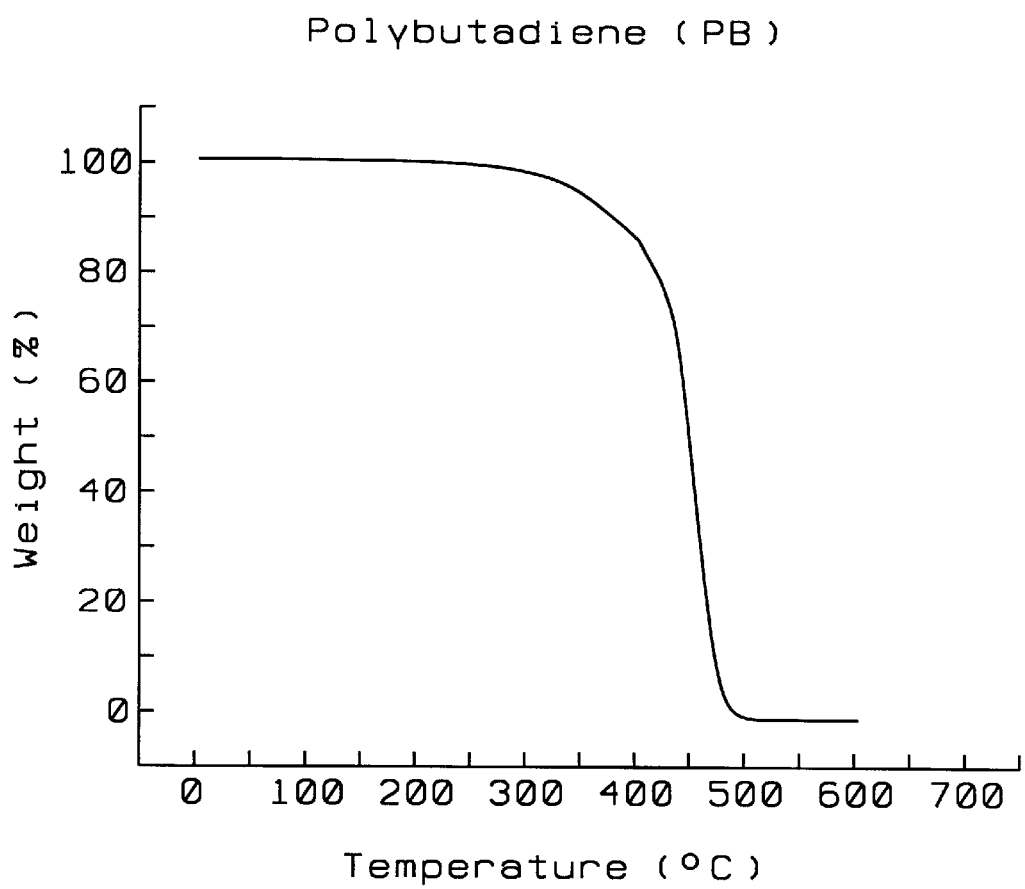
FIG. 8 is a graph illustration the decomposition temperature of polybutadine (PB) as a function of Wt %.

FIG. 8 is a graph illustration the decomposition temperature of polybutadine (PB) as a function of Wt %.

Figure 9:
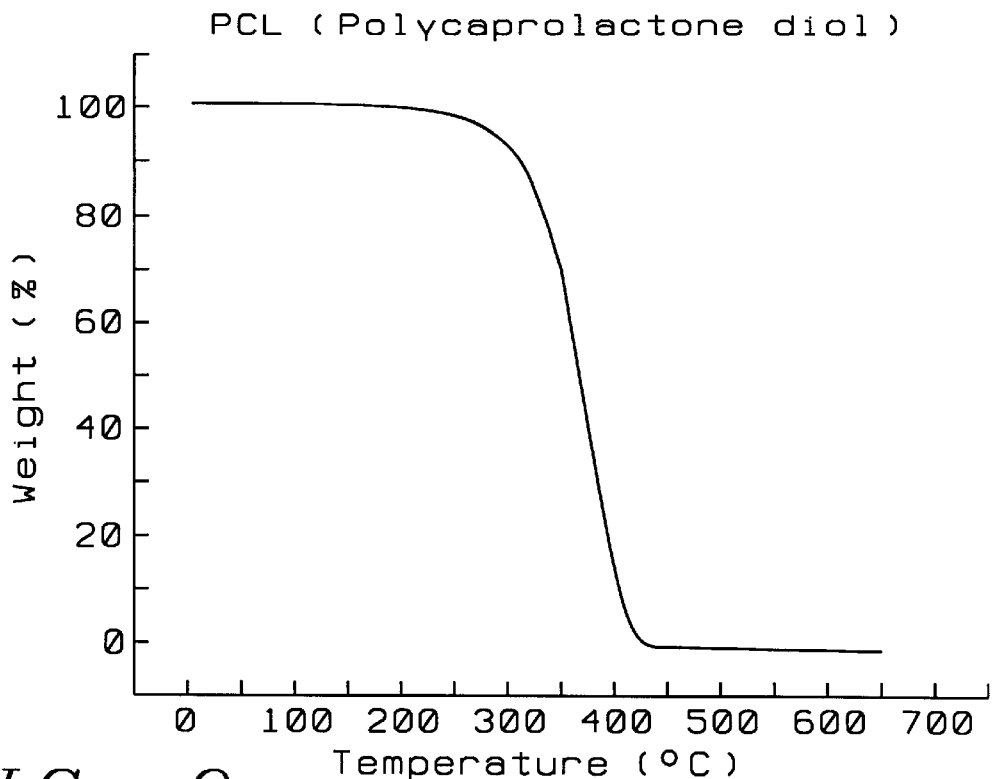
FIG. 9 is a graph illustration the decomposition temperature of polycapaprolactone diol as a function of Wt %.

FIG. 9 is a graph illustration the decomposition temperature of polycapaprolactone diol as a function of Wt %.

Figure 10:
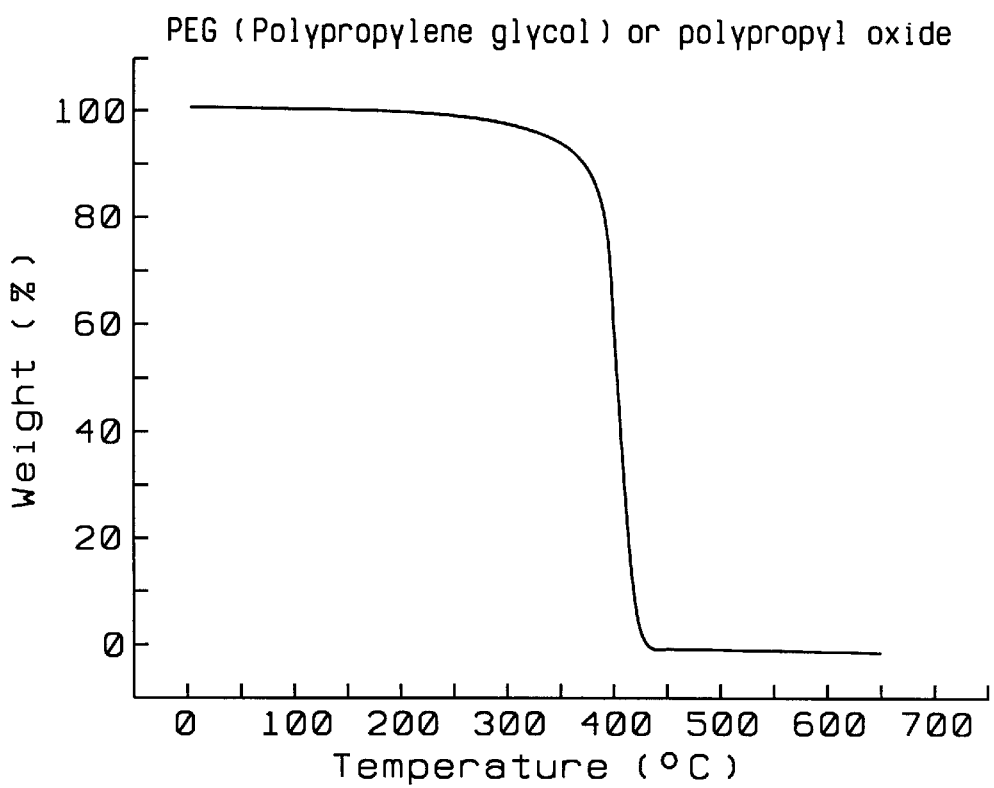
FIG. 10 is a graph illustration the decomposition temperature of polypropylene glycol (PEG) or polypropyl oxide as a function of Wt %.

FIG. 10 is a graph illustration the decomposition temperature of polypropylene glycol (PEG) or polypropyl oxide as a function of Wt %.

Figure 11:
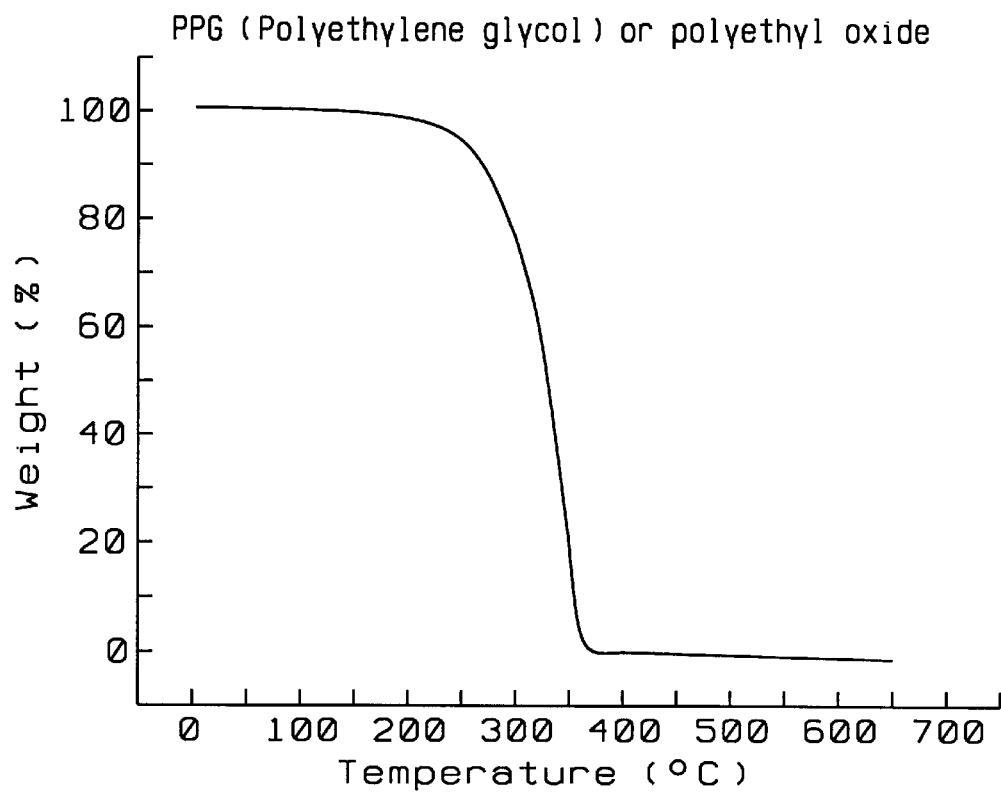
FIG. 11 is a graph illustration the decomposition temperature of polyethylene glycol (PPG) or polyethyl oxide as a function of Wt %.

FIG. 11 is a graph illustration the decomposition temperature of polyethylene glycol (PPG) or polyethyl oxide as a function of Wt %.

Depositing an Insulating Layer 50

We deposit an insulating layer 50 over the permeable dielectric layer 40. The insulating layer 50 is comprised of oxide deposited by a high density plasma chemical vapor deposition (HDPCVD) process. The insulating layer 50 has a thickness of between about 8000 and 12,000 Å.

After the deposition of the insulating layer, we preferably remove the semiconductor structure 10 from the HDPCVD chamber.

Planarizing the Insulating Layer 50.

Figure 7:
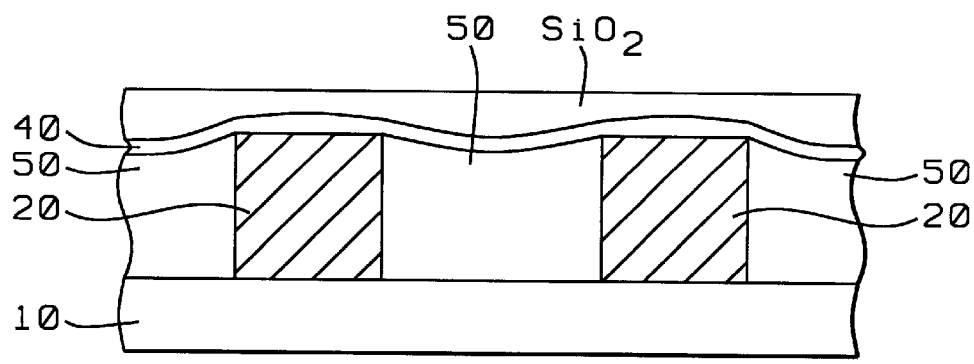

As shown in FIG. 7, we planarize the insulating layer 50. The insulating layer 50 is planarized by a CMP process.

Advantages of the Prior Art

The invention has a critical permeable dielectric layer 40 (see FIG. 5) that covers the filler material 30 during the vaporization of the filler material.

In contrast, U.S. Pat. No. 6,071,805(Liu) and other U.S. patents do not form a cap layer and vaporize filler material through openings. The invention's permeable cap layer has advantages over the open vaporization gap patents because the permeable cap layer 40 ensures that the overlying dielectric layer 70 will form on top of layer 40, and not fill in the air gap.

Advantages of the Invention

Key elements of the present invention are the permeable dielectric layer 40 that the filler layer 30 diffuses through to create the air gap 60. The filler material 30 is covered by the permeable dielectric layer 40 and is not exposed to the atmosphere. This is a critical difference compared to the prior arts. Also, the filler material is vaporized/decomposed by a process at an elevated temperature. The permeable dielectric layer is thin to allow diffusion of the vaporized filler layer through.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a conductive line structure having an air gap between the conductive lines; comprising the steps of:

a) forming spaced conductive lines over a semiconductor structure; said spaced conductive lines have top surfaces;

b) forming a filler material over said spaced conductive lines and said semiconductor structure; said filler material is formed so that said top surfaces of said spaced conductive lines are exposed; said filler material is comprised of a material selected from the group consisting of polypropylene glycol (PPG), polybutadine (PB) polyethylene glycol (PEG), and polycaprolactone diol (PCL) and is formed by a spin on process;

c) forming a permeable dielectric layer over said filler material and said top surfaces of said spaced conductive lines; said permeable dielectric layer has a property of allowing said filler material in a vapor phase, to diffuse through; said permeable dielectric layer is deposited using a high density plasma chemical vapor deposition (HDPCVD) process and uses a Si-containing gas and is performed at a temperature between 325 and 375° C.;

d) vaporizing said filler material changing the filler material into a vapor phase filler material; said vapor phase filler material diffusing through said permeable dielectric layer to form a gap between said spaced conductive lines; and e) depositing an insulating layer over said permeable dielectric layer wherein steps (c) through (e) are performed insitu in a HDPCVD chamber.

2. The method of claim 1 wherein said spaced conductive lines are comprised of an aluminum alloy.

3. The method of claim 1 wherein said filler material is comprised of polybutadine (PB).

4. The method of claim 1 wherein said permeable dielectric layer is comprised of oxide and has a thickness of between about 200 and 500 Å.

5. The method of claim 1 wherein the vaporization of said filler material 40 is performed by a $O_2$ plasma at a higher temperature than the deposition temperature of said permeable dieletric layer.

6. The method of claim 1 wherein the vaporization of said filler material layer is performed in a plasma at a temperature between 415 and 435° C.

7. The method of claim 1 wherein said insulating layer is comprised of oxide deposited by a high density plasma chemical vapor deposition (HDPCVD) process.

8. The method of claim 1 wherein said insulating layer has a thickness of between about 8000 and 12000 Å.

9. The method of claim 1 which further includes: planarizing said insulating layer; said insulating layer is planarized by a chemical-mechanical polish (CMP) process.

10. A method of fabrication of a conductive line structure having an air gap between the conductive lines; comprising the steps of:
- a) forming spaced conductive lines over a semiconductor structure; said spaced conducive lines have top surfaces;
  - (1) said spaced conductive lines are comprised of an Aluminum alloy;
- b) forming a filler material over said spaced conductive lines and said semiconductor structure;
  - (1) said filler material is comprised of a material selected from the group consisting of polypropylene glycol (PPG), polybutadine (PB), polyethylene glycol (PEG), and polycaprolactone diol (PCL) and is formed by a spin on process or chemical vapor deposition process;
- c) etching back said filler material to expose said top surfaces of said spaced conductive lines;
  - (1) said etch back is performed by a reactive ion etch (RIE) using an oxygen plasma;
- d) loading said semiconductor structure into a HDPCVD chamber of a HDPCVD tool; a wafer chuck in said HDPCVD chamber;
- e) forming a permeable dielectric layer over said filler material and said top surfaces of said spaced conductive lines; said permeable dielectric layer has a property of allowing decomposed gas phase filler material to diffuse through;
  - (1) said permeable dielectric layer is deposited using a high density plasma chemical vapor deposition (HDPCVD) process and uses a $SiH_4$ gas flow and is performed at a temperature between 325 and 375° C.;
  - (2) said permeable dielectric layer is comprised of oxide and has a thickness of between about 200 and 500 Å;
- f) vaporizing said filler material changing the filler material into a vapor phase filler material; said vapor phase filler material diffusing through said permeable dielectric layer to form a gap between said spaced conductive lines;
  - (1) the vaporizing said filter material is performed by heating said semiconductor structure to a higher temperature than the deposition temperature of said permeable dielectric layer;
  - (2) the vaporization of said filler material layer is performed in a plasma at a temperature between 415 and 435° C.;
  - (3) the vaporizing of said filler material comprises:
    - (a) shutting off the $SiH_4$ flow, and continuing the Ar and $O_2$ flows, continuing the plasma power to raise the substrate/wafer temperature;
    - (b) turning off the cooling He gas flow to the chuck to raise the wafer chuck and wafer temperature of between temperature between 415 and 435° C.;

- g) depositing an insulating layer over said permeable dielectric layer;
  - (1) said insulating layer is comprised of oxide deposited by a high density plasma chemical vapor deposition (HDPCVD) process;
  - (2) said insulating layer has a thickness of between about 8000 and 12000 Å
- h) removing said semiconductor structure from said HDPCVD chamber; and
- i) planarizing said insulating layer;
  - (1) said insulating layer is planarized by a chemical-mechanical polish (CMP) process.

11. A method of fabrication of a conductive line structure having an air gap between the conductive lines; comprising the steps of:
- a) forming spaced conductive lines over a semiconductor structure; said spaced conductive lines have top surfaces;
  - (1) said spaced conductive lines are comprised of an Aluminum alloy;
- b) forming a filler material over said spaced conductive lines and said semiconductor structure;
  - (1) said filler material is comprised of fluorinated amorphous Carbon and is formed by a chemical vapor deposition process;
- c) etching back said filler material to expose said top surface of said spaced conductive lines;
  - (1) said etch back is performed by a reactive ion etch (RIE) using an oxygen plasma;
- d) loading said semiconductor structure into a HDPCVD chamber of a HDPCVD tool; said HDPCVD tool has a wafer chuck in said HDPCVD chamber;
- e) forming a permeable dielectric layer over said filler material and said top surfaces of said spaced conductive lines; said permeable dielectric layer has a property of allowing decomposed gas phase filler material to diffuse through;
  - (1) said permeable dielectric layer is deposited using a high density plasma chemical vapor deposition (HDPCVD) process comprising flowing $SiH_4$ gas, $O_2$ and Ar gasses; and is performed at a temperate between 325 and 375° C.;
  - (2) said permeable dielectric layer is comprised of oxide and has a thickness of between about 200 and 500 Å;
- f) vaporizing said filler material changing the filler material into a vapor phase filler material; said vapor phase filler material diffusing through said permeable dielectric layer to form a gap between said spaced conductive lines;
  - (1) the vaporizing said filler material is performed by heating said semiconductor structure to a higher temperature than the deposition temperature of said permeable dielectric layer;
  - (2) the vaporization of said filler material layer is performed in a plasma at a temperature between 415 and 435° C.;
  - (3) the vaporizing of said filler material comprises:
    - (a) shutting off the $SiH_4$ flow, and continuing the Ar and $O_2$ flows, continuing the plasma power to raise the substrate/wafer temperature;
    - (b) turning off the cooling He gas flow to the chuck to raise the wafer chuck and wafer temperature of between temperature between 415 and 435° C.;
- g) depositing an insulating layer over said permeable dielectric layer;

(1) said insulating layer is comprised of oxide deposited by a high density plasma chemical vapor deposition (HDPCVD) process;
(2) said insulating layer has a thickness of between about 8000 and 12000 Å h) removing said semiconductor structure from said (HDPCVD) chamber; and
i) planarizing said insulating layer.

UNITED STATES PATENT AND TRADEMARK OFFICE
CERTIFICATE OF CORRECTION

| | | |
|---|---|---|
| PATENT NO. | : 6,380,106 B1 | Page 1 of 1 |
| DATED | : April 30, 2002 | |
| INVENTOR(S) | : Seng Keong Victor Lim, Young-way Teh, Ting Cheong Ang, Alex See and Yong Kong Siew | |

It is certified that error appears in the above-identified patent and that said Letters Patent is hereby corrected as shown below:

<u>Title page,</u>
Item [74], please delete "William J. Stoffell", and replace with -- William J. Stoffel --.

Signed and Sealed this

Nineteenth Day of November, 2002

*Attest:*

*Attesting Officer*

JAMES E. ROGAN
*Director of the United States Patent and Trademark Office*